United States Patent
Ni et al.

(10) Patent No.: US 11,545,342 B2
(45) Date of Patent: Jan. 3, 2023

(54) PLASMA PROCESSOR AND PROCESSING METHOD

(71) Applicant: ADVANCED MICRO-FABRICATION EQUIPMENT INC. CHINA, Shanghai (CN)

(72) Inventors: Tuqiang Ni, Shanghai (CN); Leyi Tu, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 23 days.

(21) Appl. No.: 16/998,209

(22) Filed: Aug. 20, 2020

(65) Prior Publication Data

US 2021/0066043 A1 Mar. 4, 2021

(30) Foreign Application Priority Data

Aug. 28, 2019 (CN) .......................... 201910799287.1

(51) Int. Cl.
*H01J 37/32* (2006.01)
*H05H 1/46* (2006.01)

(52) U.S. Cl.
CPC .. *H01J 37/32183* (2013.01); *H01J 37/32146* (2013.01); *H05H 1/46* (2013.01); *H01J 2237/334* (2013.01)

(58) Field of Classification Search
CPC ........... H01J 37/32183; H01J 37/32146; H01J 2237/334; H05H 1/46
See application file for complete search history.

(56) References Cited

U.S. PATENT DOCUMENTS

| 8,643,280 B2 | 2/2014 | Heil et al. |
| 10,026,592 B2 | 7/2018 | Chen et al. |

(Continued)

FOREIGN PATENT DOCUMENTS

| CN | 102282917 A | 12/2011 |
| CN | 106920729 A | 7/2017 |

(Continued)

*Primary Examiner* — Henry Luong
(74) *Attorney, Agent, or Firm* — Womble Bond Dickinson (US) LLP; Joseph Bach, Esq.

(57) ABSTRACT

Plasma processor including: reaction chamber having a base for placing a wafer; a source radio-frequency power supply outputting high frequency radio-frequency power into the reaction chamber to ignite and maintain plasma; a first bias radio-frequency power supply and a second bias radio-frequency power supply, the first bias radio-frequency power supply outputting a first radio-frequency signal with first frequency, the second bias radio-frequency power supply outputting a second radio-frequency signal with second frequency higher than the first frequency, the first radio-frequency signal and the second radio-frequency signal being superimposed to form a periodical first compound signal that is applied to the base; and a controller configured for tuning at least one of amplitude, frequency, average voltage or phase of the first radio-frequency signal and of the second radio-frequency signal, such that the first compound signal experiences three consecutive stages in each cycle: falling stage, flat stage, and rising stage.

18 Claims, 7 Drawing Sheets

(56) References Cited

U.S. PATENT DOCUMENTS

| | | | |
|---|---|---|---|
| 10,262,835 | B2 | 4/2019 | Nishio |
| 2010/0175832 | A1 | 7/2010 | Nishio |
| 2016/0247666 | A1 | 8/2016 | Urakawa et al. |
| 2018/0082821 | A1* | 3/2018 | Ikeda ................ H01J 37/32183 |
| 2018/0096822 | A1 | 4/2018 | Urakawa et al. |
| 2019/0122863 | A1 | 4/2019 | Nagaseki et al. |

FOREIGN PATENT DOCUMENTS

| | | |
|---|---|---|
| KR | 101095602 B1 | 12/2011 |
| TW | 200952560 A | 12/2009 |
| TW | 201802934 A | 1/2018 |
| TW | 201812830 A | 4/2018 |

\* cited by examiner

PLASMA PROCESSOR AND PROCESSING METHOD

RELATED APPLICATION

The present application claims priority to and the benefit of Chinese Patent Application No. 201910799287.1, filed on Aug. 28, 2019, and the disclosure of which is hereby incorporated by reference in its entirety.

FIELD

Embodiments of the present disclosure relate to semiconductor processing equipment, and more particularly relate to a plasma processing apparatus and a processing method.

BACKGROUND

Vacuum processing apparatuses are widely applied in the semiconductor industry, among which plasma processing apparatuses and chemical vapor deposition apparatuses are dominant ones. The plasma processing apparatus generates plasma by radio-frequency coupled discharge, and then performs processing such as deposition and etching with the plasma.

In a plasma etching process, two radio-frequency power supplies are generally used: a source radio-frequency power supply and a bias radio-frequency power supply. The source radio-frequency power supply outputs a high frequency radio-frequency power (e.g., 60 MHz) to excite gas to generate plasma, mainly used for controlling concentration of the plasma. The bias radio-frequency power supply outputs a low frequency radio-frequency power (e.g., 2 MHz or 13 MHz), mainly used for controlling ion energy in the plasma to bombard a substrate. Plasma concentration and ion bombardment energy have a significant impact on etching rates. Therefore, a method for improving plasma concentration and ion bombardment energy has been always pursued in the industry. The importance of such a method is prominent in high aspect ratio (HAR) etching applications. Plasma concentration is mainly controlled by the source radio-frequency power supply, such that the plasma concentration is usually improved by increasing power of the source radio-frequency power supply. Enhancement of the ion energy in the plasma to bombard the substrate is mainly implemented by increasing the sheath voltage on the substrate surface, which can be achieved by two ways: 1) increasing power of the bias radio-frequency power supply to improve sheath voltage on the substrate surface. The ions in the plasma are accelerated in the sheath(s) to bombard the substrate; the larger the sheath voltage is, the greater the ion bombardment energy is. However, increasing power of the bias radio-frequency power supply will have some negative impacts, for example, the heat dissipation system of the chamber will become more complex, and the service life of chamber parts will be shortened due to stronger bombardment. 2) increasing the ratio of sizes of the upper and lower electrodes of the chamber. The sheath voltage on the substrate is associated with the sizes of the upper and lower electrodes (i.e., a showerhead and an electrostatic chuck) in the plasma processing chamber. The larger the ratio of the sizes of the upper and lower electrodes is, the greater the value of the sheath voltage is. However, change of the sizes of upper and lower electrodes is constrained by the volume of the chamber; particularly when the volume of the chamber is fixed, it is hard to freely change the sizes of the upper and lower electrodes. Therefore, this approach has a relatively poor flexibility.

Accordingly, the industry still lacks a novel method of boosting ion energy in plasma to bombard a substrate. Such a method is beneficial to a high aspect ratio etching process.

SUMMARY

The present disclosure provides a plasma processor, comprising: a reaction chamber, in the reaction chamber being provided a base, the base being used to hold a wafer; a source radio-frequency power supply configured for outputting high frequency radio-frequency power into the reaction chamber so as to ignite and maintain plasma; a first bias radio-frequency power supply and a second bias radio-frequency power supply, the first bias radio-frequency power supply outputting a first radio-frequency signal with first frequency, the second bias radio-frequency power supply outputting a second radio-frequency signal with second frequency, the first frequency being smaller than the second frequency, the first radio-frequency signal and the second radio-frequency signal being superimposed to form a periodical first compound signal that is applied to the base; and a controller configured for tuning at least one of amplitude, frequency, average voltage or phase of the first radio-frequency signal and of the second radio-frequency signal, such that the first compound signal includes three consecutive stages in each cycle: falling stage, flat stage, and rising stage, wherein time taken by the falling stage in each cycle is less than half period of the first radio-frequency signal, and duration of the flat stage is greater than $\frac{1}{4}$ period of the first radio-frequency signal.

Alternatively, the controller is configured for tuning frequency of the first radio-frequency signal and frequency of the second radio-frequency signal such that the second frequency is twice the first frequency.

Alternatively, the first frequency is selected from one of 400 KHz, 600 KHz, 800 KHz, or 1 MHz, and the second frequency is selected from one of 800 KHz, 1200 KHz, 1600 KHz, or 2 MHz.

Alternatively, the controller is configured for tuning phase of the first radio-frequency signal and phase of the second radio-frequency signal such that phase difference between the first radio-frequency signal and the second radio-frequency signal is between −75° and −105°.

Alternatively, the controller is configured for tuning amplitude of the first radio-frequency signal and amplitude of the second radio-frequency signal such that amplitude ratio of the first radio-frequency signal and the second radio-frequency signal is 4:1~2.8:1.

Alternatively, the controller is configured for tuning phase and amplitude of the first radio-frequency signal and tuning and phase of the second radio-frequency signal such that phase difference between the first radio-frequency signal and the second radio-frequency signal is −90°, and amplitude ratio of the first radio-frequency signal and the second radio-frequency signal is 3:1.

Alternatively, duration of the falling stage of the first compound signal is less than 35% of total duration of the period of the first compound signal.

Alternatively, the plasma processor further comprises a first matching circuit, a second matching circuit, and a filter, the first matching circuit being arranged between the first bias radio-frequency power supply and the reaction chamber, the second matching circuit being arranged between the second bias radio-frequency power supply and the reaction chamber, and the filter being arranged between the first matching circuit and the second matching circuit.

Alternatively, the plasma processor further comprises: a third bias radio-frequency power supply configured for outputting a third radio-frequency signal with third frequency, the third frequency being greater than the first frequency and the second frequency, the third radio-frequency signal being superimposed with the first radio-frequency signal and the second radio-frequency signal to form a second compound signal that is applied to the base; a controller configured for tuning at least one of amplitude, frequency, average voltage or phase of the first radio-frequency signal, of the second radio-frequency signal, and of the third radio-frequency signal such that the second compound signal includes three consecutive stages in each cycle: falling stage, flat stage, and rising stage, wherein time taken by the falling stage of the second compound signal in each cycle is less than half period of the first radio-frequency signal, and duration of the flat stage is greater than ¼ period of the first radio-frequency signal.

Alternatively, the controller is configured for tuning frequency of the first radio-frequency signal, frequency of the second radio-frequency signal, and frequency of the third radio-frequency signal such that the second frequency is twice the first frequency, and the third frequency is thrice the first frequency.

Alternatively, the first frequency is selected from one of 400 KHz, 600 kHz, 800 KHz, or 1 MHz, the second frequency is selected from one of 800 KHz, 1200 KHz, 1600 KHz, or 2 MHz, and the third frequency is selected from one of 1200 KHz, 1800 KHz, 2400 KHz, or 3 MHz.

Alternatively, the controller is configured for tuning phase and amplitude of the first radio-frequency signal, phase and amplitude of the second radio-frequency signal, and phase and amplitude of the third radio-frequency signal such that phase difference between the second radio-frequency signal and the first radio-frequency signal is −90°, phase difference between the third radio-frequency signal and the first radio-frequency signal is −180°, and amplitude ratio of the first radio-frequency signal, the second radio-frequency signal, and the third radio-frequency signal is 7:4:1.

The present disclosure further comprises a method for tuning radio-frequency signals applied to a plasma processor, the plasma processor comprising a reaction chamber, the reaction chamber including a base, wherein the method comprises: outputting a high frequency radio-frequency power into the reaction chamber; outputting a first radio-frequency signal with first frequency and a second radio-frequency signal with second frequency, the first frequency being smaller than the second frequency, the first radio-frequency signal and the second radio-frequency signal being superimposed to form a first compound signal that is applied to a base in the plasma processor; and tuning at least one of amplitude, frequency, average voltage or phase of the first radio-frequency signal and of the second radio-frequency signal, such that the first compound signal includes three consecutive stages in each cycle: falling stage, flat stage, and rising stage, wherein time taken by the falling stage in each cycle is less than half period of the first radio-frequency signal, and duration of the flat stage is greater than ¼ period of the first radio-frequency signal.

Alternatively, the frequency of the second radio-frequency signal is tuned to be twice the frequency of the first radio-frequency signal.

Alternatively, the method further comprises: outputting a third radio-frequency signal with third frequency, the third frequency being greater than the first frequency and the second frequency, the third radio-frequency signal being superimposed with the first radio-frequency signal and the second radio-frequency signal to form a second compound signal that is applied to the base in the plasma processor; tuning at least one of amplitude, frequency, average voltage or phase of the first radio-frequency signal, of the second radio-frequency signal, and of the third radio-frequency signal such that the second compound signal includes three consecutive stages in each cycle: falling stage, flat stage, and rising stage, wherein time taken by the falling stage of the second compound signal in each cycle is less than half period of the first radio-frequency compound signal, and duration of the flat stage is greater than ¼ period of the first radio-frequency compound signal.

Alternatively, the frequency of the second radio-frequency signal is tuned to be twice the frequency of the second radio-frequency signal, and the frequency of the third radio-frequency signal is tuned to be thrice the frequency of the first radio-frequency signal.

The present disclosure further provides a plasma processor, comprising: a reaction chamber, in the reaction chamber being provided a base, the base being used to hold a wafer; a source radio-frequency power supply configured for outputting a high frequency radio-frequency power into the reaction chamber so as to ignite and maintain plasma; and a first bias radio-frequency power supply and a second bias radio-frequency power supply, the first bias radio-frequency power supply outputting a first radio-frequency signal with first frequency, the second bias radio-frequency power supply outputting a second radio-frequency signal with second frequency, the first frequency being smaller than the second frequency, the first radio-frequency signal and the second radio-frequency signal being superimposed to form a periodical first compound signal that is applied to the base; a controller configured for tuning at least one of amplitude, frequency, average voltage or phase of the first radio-frequency signal and of the second radio-frequency signal, such that the first compound signal includes three consecutive stages in each cycle: rising stage, flat stage, and falling stage, wherein time taken by the falling stage in each cycle is less than half period of the first radio-frequency signal, and duration of the flat stage is greater than ¼ period of the first radio-frequency signal.

The present disclosure further comprises a plasma processor, comprising: a reaction chamber, in the reaction chamber being provided a base, on the base being used to hold a wafer; a source radio-frequency power supply configured for outputting a high frequency radio-frequency power into the reaction chamber so as to ignite and maintain plasma; a bias radio-frequency power supply including a signal generator, the signal generator being configured for generating a periodical approximate square wave, each cycle of the approximate square wave includes three consecutive stages: falling stage, flat stage, and rising stage, wherein duration of the flat stage is greater than ¼ of the period; a power amplifier, configured for amplifying the approximate square wave; a first filter, configured for selectively passing a first radio-frequency signal with first frequency from the amplified approximate square wave; a second filter, configured for selectively passing a second radio-frequency signal with second frequency from the amplified approximate square wave; a first matching circuit, configured for matching the first radio-frequency signal with first frequency and inputting the first radio-frequency signal into the reaction chamber; and a second matching circuit, configured for matching the second radio-frequency signal with second frequency and inputting the second radio-frequency signal into the reaction chamber.

BRIEF DESCRIPTION OF THE DRAWINGS

To elucidate the technical solutions of the present disclosure or the prior art, the drawings used in describing the embodiments of the present disclosure or the prior art will be briefly introduced below. It is apparent that the drawings as described only relate to some embodiments of the present disclosure. To those skilled in the art, other drawings may be derived based on these drawings without exercise of inventive work, wherein.

DETAILED DESCRIPTION OF EMBODIMENTS

To make the above and other objectives, features, and advantages of the present disclosure more apparent and comprehensible, some embodiments of the present disclosure will be described in detail with reference to the accompanying drawings.

Many details are illustrated in the description below for sufficient understanding of the present disclosure; however, the present disclosure may also be implemented using other embodiments not described herein, and those skilled in the art may make similar extensions without departing from the scope of the present disclosure; therefore, the present disclosure is not limited to the embodiments disclosed below.

Figure 1:
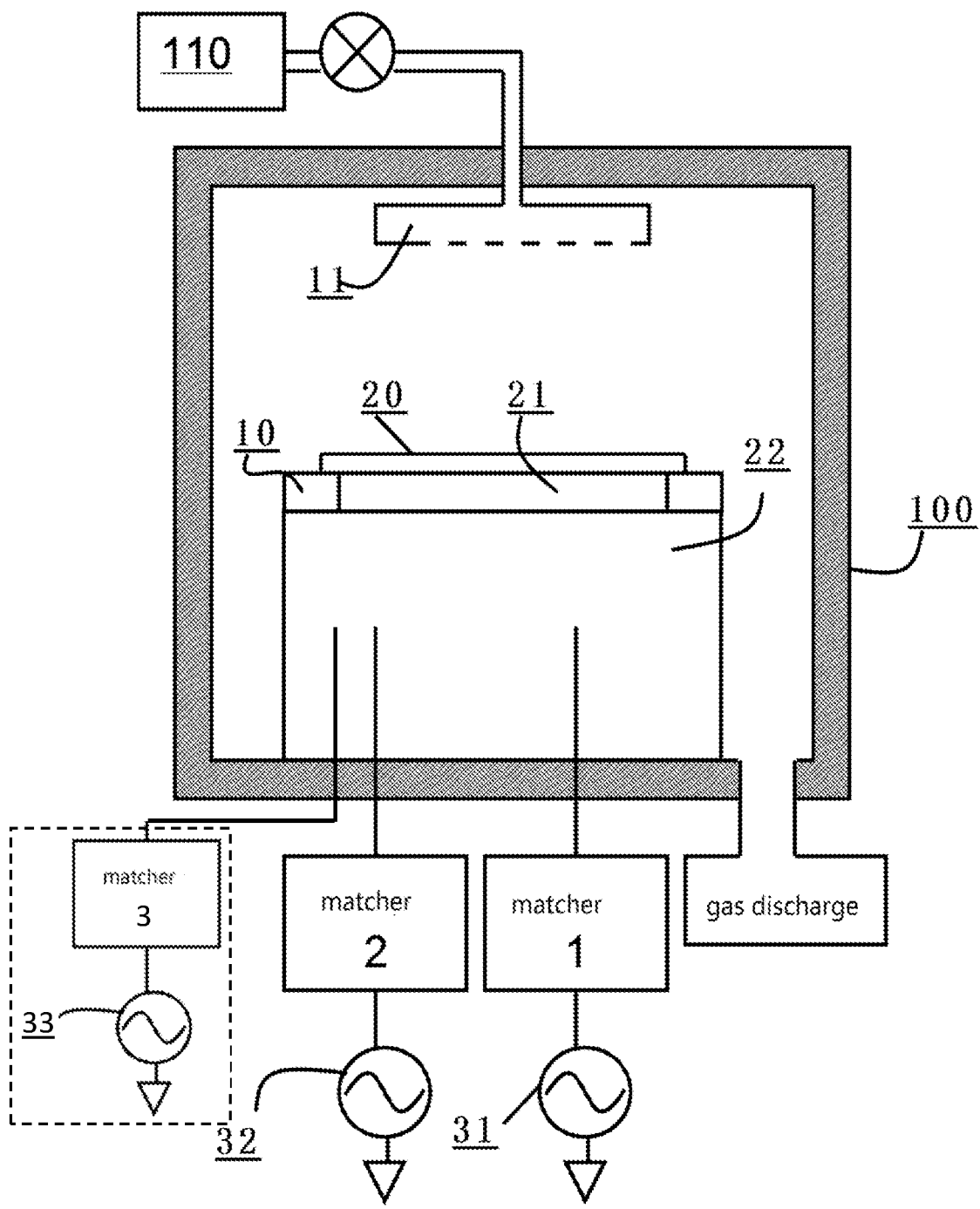
FIG. 1 is a structural schematic diagram of a capacitive coupling plasma processing apparatus in existing practices.

FIG. 1 shows a capacitive coupling plasma processing apparatus in existing practices, comprising a reaction chamber 100, in the reaction chamber being provided an electrically conductive base 22 that serves as a lower electrode to connect a source radio-frequency power supply 32 and a bias radio-frequency power supply 31, wherein the source radio-frequency power supply 32 outputs, via a matcher 2, a high frequency (HF) radio-frequency power to the base 22, and the bias radio-frequency power supply 31 outputs, via a matcher 1, a bias/low-frequency (LF) radio-frequency power to the base 22, wherein the high frequency radio-frequency power outputted by the source radio-frequency power supply 32 is configured for igniting and maintaining plasma in the reaction chamber, and the low frequency radio-frequency power outputted by the bias radio-frequency power supply 31 is configured for controlling the bias voltage ($V_{dc}$) on the substrate 20. A to-be-processed substrate 20 is fixed onto an electrostatic chuck 21 on the base 22, and a focusing ring 21 is further provided surrounding the substrate and the electrostatic chuck. A disc-shaped gas showerhead 11 is disposed above the reaction chamber opposite to the electrostatic chuck, and the gas showerhead 11 is connected to an external reaction gas source 110 via a gas supply pipeline.

Figure 2:
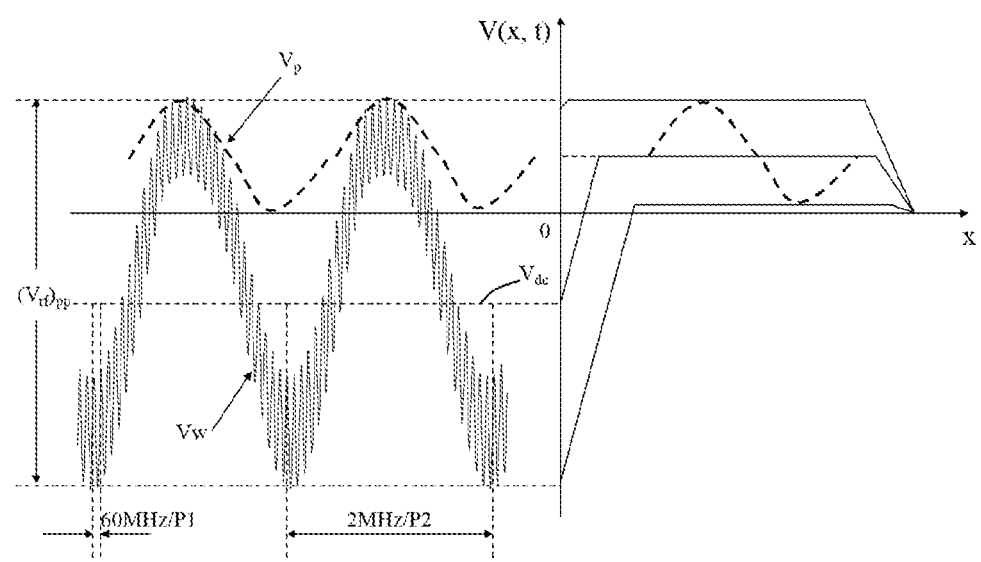
FIG. 2 is a voltage waveform schematic diagram of the plasma and substrate in the capacitive coupling plasma processor.

As shown in FIG. 2, after the plasma is ignited, the plasma voltage in the reaction chamber is $V_p$, the voltage on the upper surface of the substrate is $V_w$, and the bias voltage is $V_{dc}$. In the processing apparatus, the frequency of the high frequency radio-frequency (HF) signal is 60 MHz, and the frequency of the low frequency radio-frequency (LF) signal is 2 MHz, and their cycle lengths are P1 and P2, respectively. It may be seen that a high frequency radio-frequency voltage is superimposed on a low frequency radio-frequency voltage, which are jointly fed into the reaction chamber. During operating of the plasma processing apparatus, plasma impedance will experience a drastic change before and after ignition or upon variation of parameters such as input radio-frequency power and gas pressure; therefore, active tunable elements in matchers 1, 2 are applied to compensate for the impedance change, such that the radio-frequency powers outputted by the source radio-frequency power supply 32 and the bias radio-frequency power supply 31 can be effectively transmitted into the reaction chamber without being reflected back into the radio-frequency power supplies; In the impedance matching state the reflection power is the minimized, most of the power from the radio-frequency power supplies is fed into the chamber, little power consumed when flowing through circuit. Power of the output signals of the radio-frequency power supplies has an influence on the voltage $V_w$ on the upper surface of the substrate. Generally, frequency of the output signals of the radio-frequency power supplies is equal to the frequency of the voltage on the upper surface of the substrate. Moreover, the greater the power of the output signals, the larger the voltage amplitude $(V_{rf})_{pp}$ on the upper surface of the substrate. The average value of the voltage $V_w$ on the upper surface of the substrate is the bias voltage $V_{dc}$. As the area of the upper electrode (e.g., showerhead) is greater than the area of the lower electrode (e.g., electrostatic chuck), a voltage $V_w$ shown in FIG. 2 will be formed. The voltage curve is not longitudinally symmetrical relative to the x-axis, but generally offsets downwardly along the y-axis; therefore, the bias voltage $V_{dc}$ is a negative value. The voltage of the plasma generated in the chamber is $V_p$. As the movement speeds of electrons and ions in the generated plasma are different, sheaths will be generated on the surfaces of the upper and lower electrodes; almost no electrons exist in such sheaths, and the potential falls towards the substrate. The voltage $V_p$ of the plasma minus the voltage $V_w$ of the upper surface of the substrate is equal to the sheath voltage on the substrate. The sheath voltage mainly plays a role of accelerating the charged ions. The plasma voltage $V_p$ and the bias voltage $V_{dc}$ satisfy the following relation:

$$2V_p \approx (V_{rf})_{pp}/2 - |V_{dc}|.$$

Figure 3A:
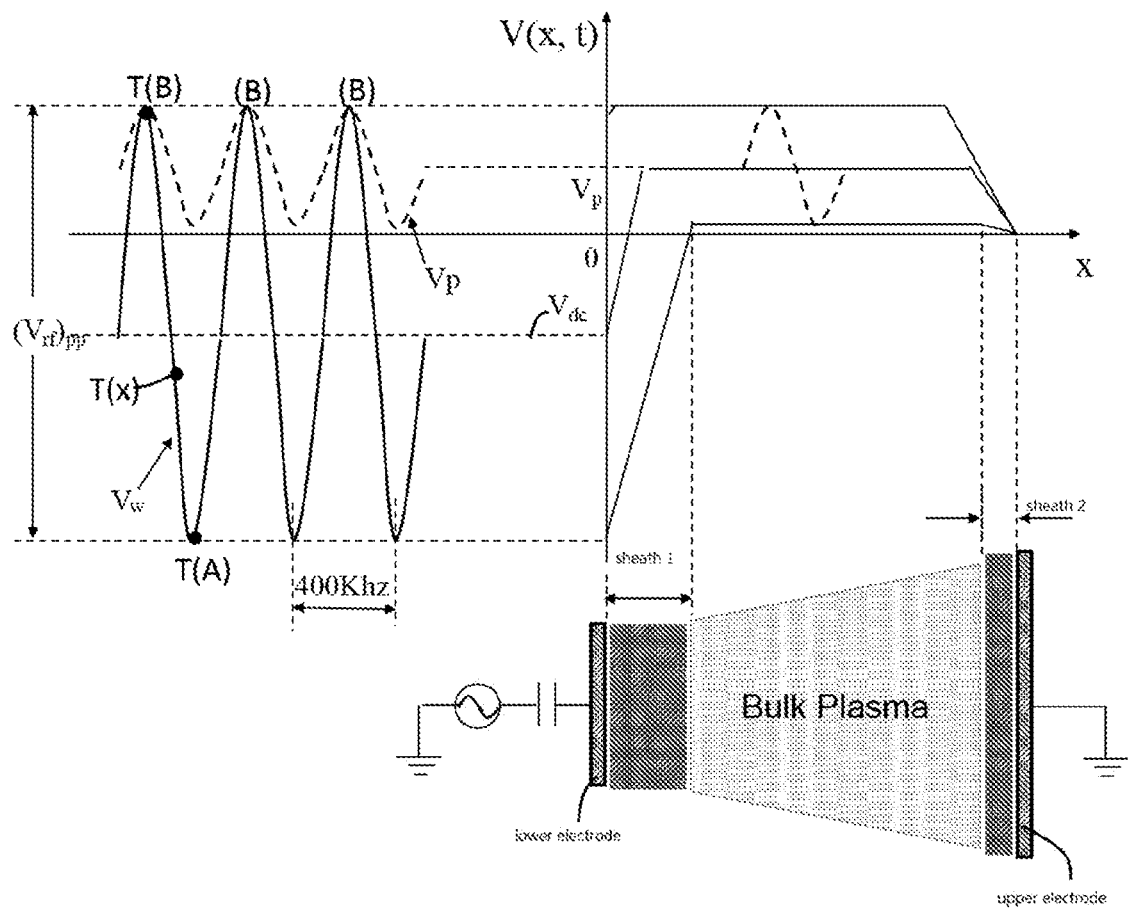
FIG. 3a is a first distribution pattern of the plasma in the capacitive coupling plasma processor.
Figure 3B:
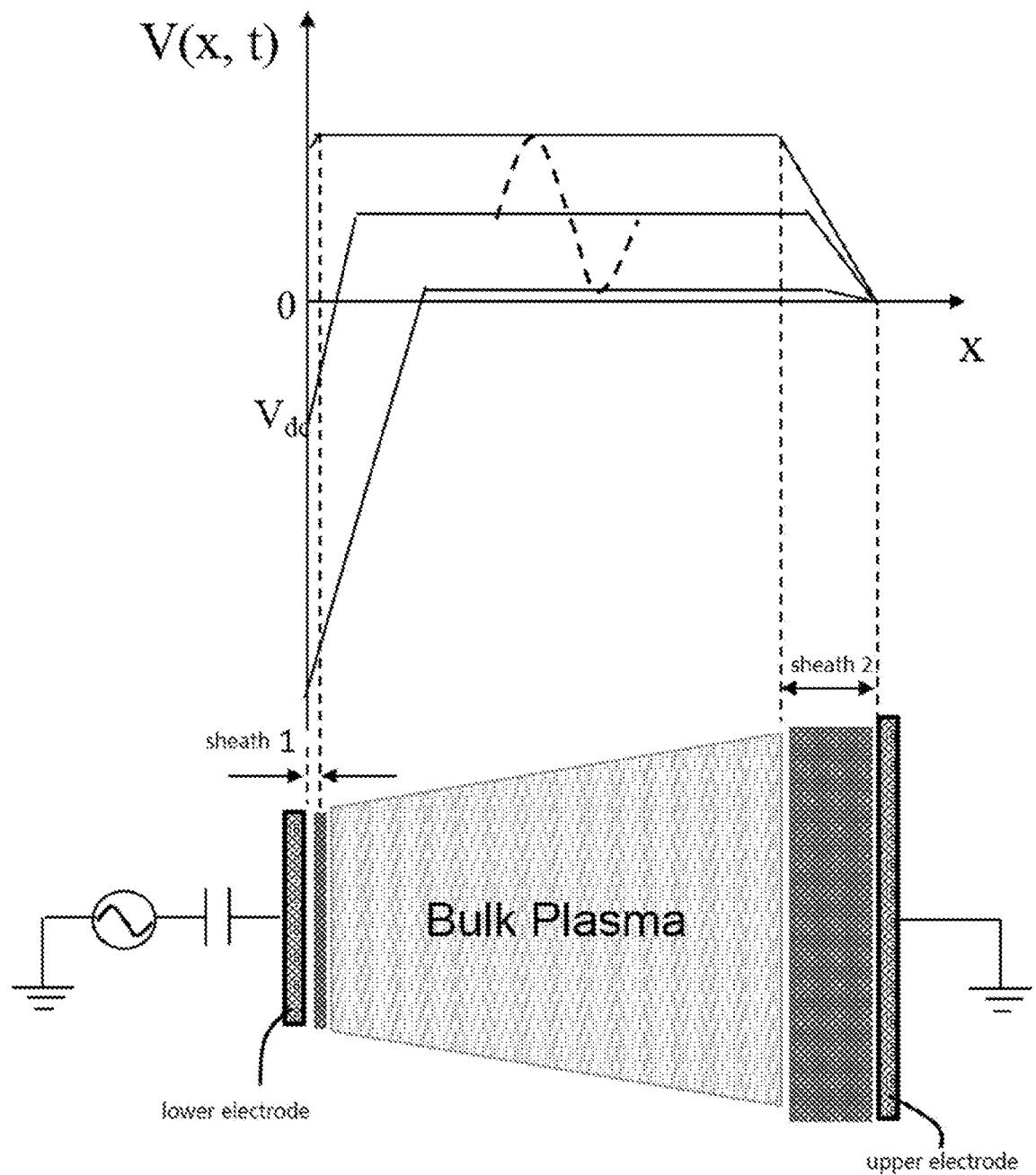
FIG. 3b is a second distribution pattern of the plasma in the capacitive coupling plasma processor.

FIGS. 3a and 3b show distribution patterns of plasma in the capacitive coupling plasma processing apparatus. These diagrams show more details of the variable states of plasma distribution and sheath distribution. With evolution of plasma processing techniques, an ultra-low bias radio-frequency frequency power supply is required in many processes, wherein the frequency of the low frequency radio-frequency signal outputted thereby is generally lower than 1 MHz, particularly lower than or equal to 400 KHz. As shown in FIG. 3a, the output voltage of the low frequency radio-frequency power supply (400 KHz) varies with time, and the output voltage varies one cycle within one cycle length(2.5 ps). The low frequency radio-frequency voltage synchronously affects the voltage on the upper surface of the substrate. When the low frequency radio-frequency voltage reaches the minimal value, the lower electrode has the lowest voltage, and the voltage on the upper surface of the substrate also has the lowest voltage, e.g., at T(A) time in the figure, which causes the substrate surface above the lower electrode (base 22) to have the thickest sheath 1, and the corresponding upper electrode surface (upper electrode 11 and part of the surrounding auxiliary ring) to have the thinnest sheath 2, and then the plasm is lifted upward. As shown in FIG. 3b, the output voltage of the low frequency radio-frequency power supply reaches the maximum value, and the voltage on the upper surface of the substrate also reaches the maximum value, i.e., at T(B) time, the thickness of the sheath 1 at the substrate surface becomes the minimal, and the sheath 2 on the upper electrode surface has the maximum value; then the plasma is pressed downward to the lowest position. At any point T(X) from T(A) to T(B), the plasma will vary continuously with the output voltage of the low frequency radio-frequency power supply. Because the area of the upper electrode is different from that of the lower electrode (it is common that the area of the upper electrode is greater than that of the lower electrode), the plasmas will not only move up and down, but will also vary in the distribution pattern.

Figure 4A:
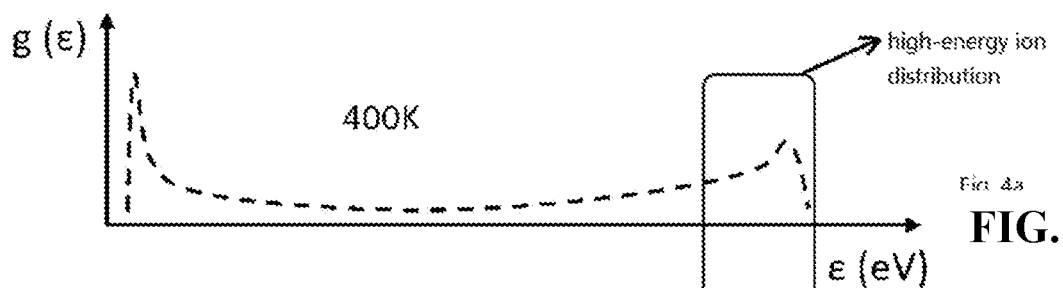
FIG. 4a is an ion ratio distribution function diagram generated by a 400 KHz radio-frequency power supply.

The thickness of the sheath varies periodically with the voltage on the upper surface of the substrate. When the thickness of the sheath reaches the maximum, the ion acceleration in the plasma also reaches the maximum; at this point, the ions achieve the strongest bombardment energy. When the thickness of the sheath reaches the minimal, the voltage on the upper surface of the substrate reaches the maximum; at this point, the ions achieve the lowest bombardment energy. When the voltage on the upper surface of the substrate is positive, it contributes some to increase of the plasma concentration. Such periodical variation exhibited by the voltage and thickness of the plasma sheath has an impact on energy distribution of the ions. FIG. 4a substantially shows the ion ratio distribution diagram in a low frequency condition. In the distribution diagram, the transverse axis represents ion energy; the longitudinal axis represents the ion ratio distribution, shows the ratio of ions with specific energy VS total ions. The ion ratio distribution diagram generally has a two-peak waveform at low-energy region and high-energy region, respectively representing that the high ratio of ions with extreme low-energy and high-energy. It is shown in FIG. 4a that the peak width of the ion ratio distribution diagram is relatively large at the high-energy position, which indicates that the ratio of high-energy ions are distributed in a relatively large range, not concentrated. However, energy concentration (i.e., a relatively narrow band) of high-energy ions can offer a better etching effect.

Figure 4B:
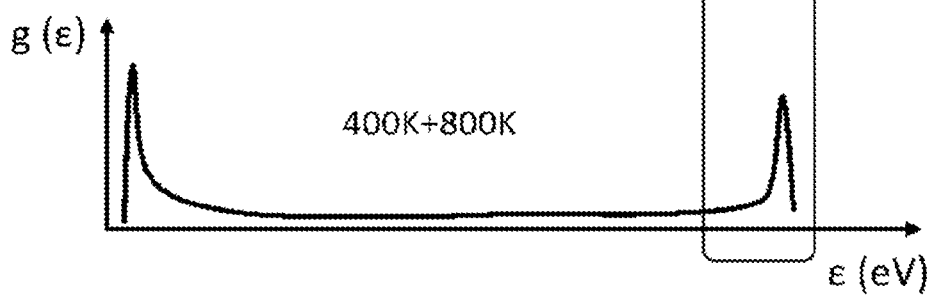
FIG. 4b is an ion ratio distribution function diagram generated after superimposition of a 400 KHz radio-frequency power supply and an 800 KHz radio-frequency power supply.

Therefore, the inventors contemplate a method of boosting ion bombard energy, i.e., boosting ion energy by tuning ion ratio distribution pattern (particularly high-energy ion distribution), which is different from existing practices of merely increasing the sheath voltage on the surfaces of the substrate, thereby achieving a better etching effect. The inventors find that when the bias radio-frequency signal applied to the substrate is a sinusoidal signal, the voltage $V_w$ on the upper surface of the substrate varies slowly in a sinusoidal wave with the bias radio-frequency power supply output voltage; at this point, the ion ratio distribution pattern of the plasma has a relatively wide energy band width in the high-energy region. However, if the bias radio-frequency signal applied to the substrate exhibits a square wave or an approximate square wave with a relatively short high-low voltage switching time, the voltage $V_w$ on the upper surface of the substrate exhibits a fast square wave or approximate square wave variation with the bias radio-frequency signal, and the energy distribution pattern of the plasma high-energy ions becomes very concentrated, as shown in FIG. 4b. This is because when the voltage on the upper surface of the substrate quickly switches from the positive value region to the negative value region, the ions can achieve a greater acceleration within a short time, thereby achieving a stronger bombardment energy. By combining the output voltage signals from different radio-frequency power supplies, the present disclosure enables the superimposed radio-frequency signal applied to the base to switch quickly between the high and low amplitudes, such that the voltage on the upper surface of the substrate achieves a square wave or approximate square wave pattern. In this way, the energy distribution pattern of the high-energy ions in the plasma is concentrated, thereby boosting the ion bombardment energy. Hereinafter, detailed illustration will be made through different embodiments.

Figure 5:
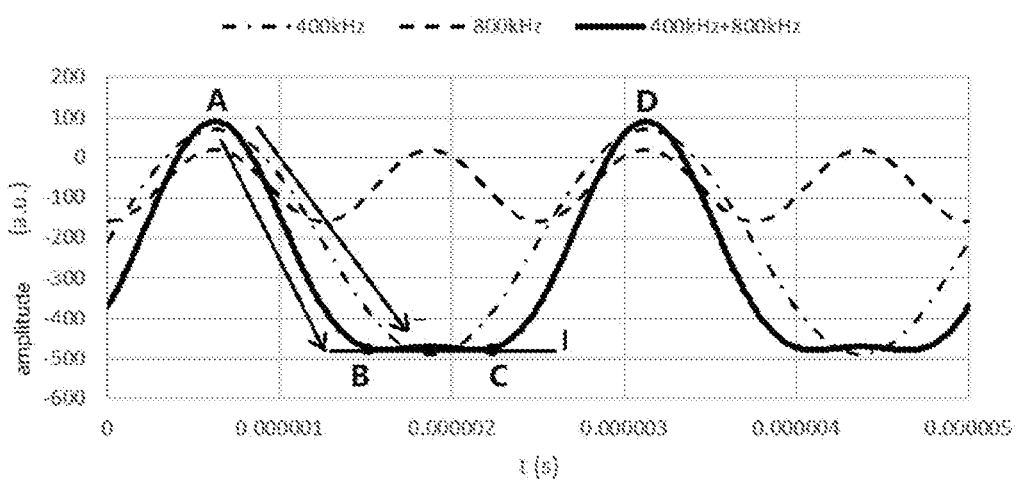
FIG. 5 is a simulation diagram of potential on the substrate upper surface generated by two radio-frequency power supplies according to one embodiment of the present disclosure.

FIG. 5 is a simulated diagram of potential on the upper surface of the substrate as generated by a combination of different bias radio-frequency power supplies according to one embodiment of the present disclosure. The dashed line represents the curve of the potential on the upper surface of the substrate as generated by a 400 KHz bias radio-frequency power supply, while the dot-dash line represents the curve of the potential on the substrate as generated by another 800 KHz bias radio-frequency power supply, and the solid line represents the curve of the compound potential on the upper surface of the substrate formed by superimposition of the above two voltage curves. In this embodiment, the frequencies of the two bias radio-frequency power supplies are 400 KHz and 800 KHz, respectively; then, the frequencies of the curves of the potentials generated on the upper surface of the substrate are also 400 KHz and 800 KHz, respectively. The phase difference between the 400 KHz potential curve and the 800 KHz potential curve is −90°, and the amplitude ratio therebetween is 3:1. it is seen from FIG. 5 that the compound potential curve superimposed from two potential curves with the characteristics above experiences three consecutive stages: falling stage AB, flat stage BC, and rising stage CD. The compound curve exhibits an approximate square wave pattern. In the compound potential curve shown in FIG. 5, in one period, point A and point D represent maximal values of the potential; in the flat stage BC, the compound potential is maintained at a substantially stable voltage within a certain time segment (e.g., ¼ period greater than 400 KHz, i.e., greater than 0.6 ps); in this stage, the variation amplitude of the potential within an acceptable limit, e.g., the variation amplitude is within 5% or within 10%. Therefore, the flat stage BC has the same average voltage, which is indicated by straight line 1 in the figure. The intersected points between the straight line 1 and the compound potential curve are denoted as B and C. The falling stage AB of the superimposed potential curve is steeper than the falling stage (the half falling period of the 400 KHz or 800 KHz potential curve) of any potential curve before superimposition, i.e., the potential change is faster. As indicated above, this results in a more concentrated distribution of the high-energy ions, thereby offering a higher etching efficiency.

It may be seen from the compound potential curve shown in FIG. 5 that the flat stage BC has a first average voltage, and a tip stage may be further defined opposite to the flat stage BC nearby A and D, wherein the output voltage in the tip stage has the highest potential and an interval in which potential vary from the highest potential to 95% or 90% of the highest potential Tp. In the tip stage, the potential in the tip stage rapidly reaches the maximum value and then falls rapidly and has a second average voltage, wherein the second average voltage is a positive potential and has the largest amplitude; the first average voltage is negative and has the largest amplitude; and the output potential also transits between the first average voltage and the second average voltage. The duration of the tip stage is apparently shorter than the flat stage, generally less than ½ of the latter.

It needs to be noted that the above embodiment only provides one solution of tuning the output voltages of two bias radio-frequency power supplies to form an approximate square wave curve of the potential on the upper surface of the substrate. Tuning the frequency, phase or amplitude of respective output voltages of two bias radio-frequency power supplies also enables the curves of the potentials on the upper surface of the substrate to exhibit different approximate square wave patterns. For example, the frequency of the first bias radio-frequency power supply is 400 KHz, 600 KHz, 800 KHz, or 1 MHz, and correspondingly, the frequency of the second bias radio-frequency power supply is 800 KHz, 1200 KHz, 1600 KHz, or 2 MHz. When the frequency is fixed to the above multiple relationship, tuning different amplitudes of two input voltages can also achieve the approximate square wave pattern, as long as the flat stage of the potential curve is within an acceptable range. For example, the amplitude ratio of the two output voltages may be between 4:1~2.8:1. When the frequency is fixed to the above multiple relationship, tuning the phase difference between two output voltages can also achieve the approximate square wave pattern. For example, the phase difference ranges from −75° to −105°. Besides, tuning the frequency, phase, average voltage or amplitude of the output signals of two bias radio-frequency power supplies may also change the characteristics of the approximate square wave, e.g., the duration of the flat stage of the approximate square wave, the positive or negative value of the potential in the flat stage.

Figure 6:
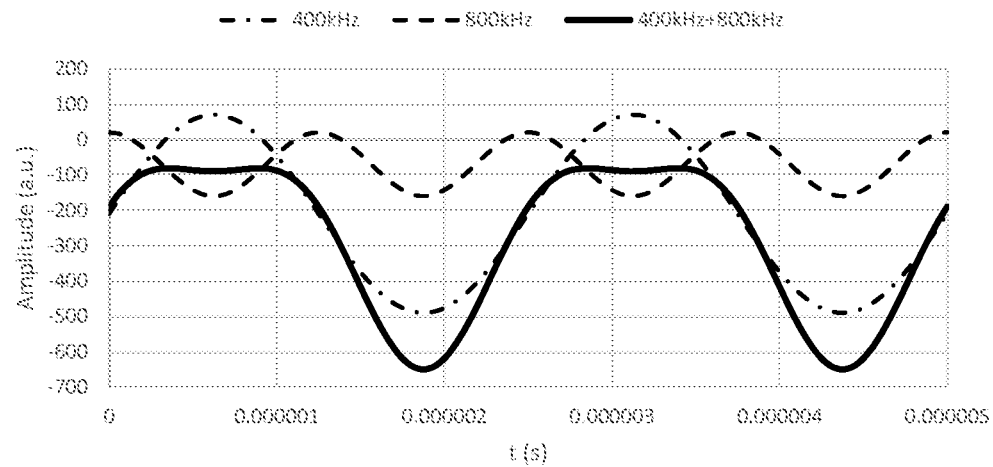
FIG. 6 is a simulation diagram of potential on the substrate upper surface generated by two radio-frequency power supplies according to another embodiment of the present disclosure.

In one embodiment, the frequencies of the signals generated by two bias radio-frequency power supplies are 400 KHz and 800 KHz, respectively; their phase difference is 90°, and their amplitude ratio is 3:1; as such, the potential curve diagram shown in FIG. 6 may be formed. In FIG. 6, the compound potential curve superimposed by the potential curves of the two signals also experiences three consecutive stages: rising stage, flat stage, and falling stage. The compound curve also exhibits an approximate square wave pattern. The characteristics of the three stages are similar to FIG. 5. In the flat stage, the compound potential is maintained at a substantially stable level within a certain time segment (e.g., ¼ period greater than 400 KHz, i.e., greater than about 0.6 µs); in this stage, the amplitude of the potential varies within an acceptable limit, e.g., the variation amplitude is within 5% or within 10%. Its rising stage is steeper than the rising stage (the half rising period of the 400 KHz or 800 KHz potential curve) of any potential curve before superimposition, i.e., the potential change is faster. Tuning the signals generated by the two bias radio-frequency power supplies enables the average voltage of the flat stage to be positive or negative.

Figure 7:
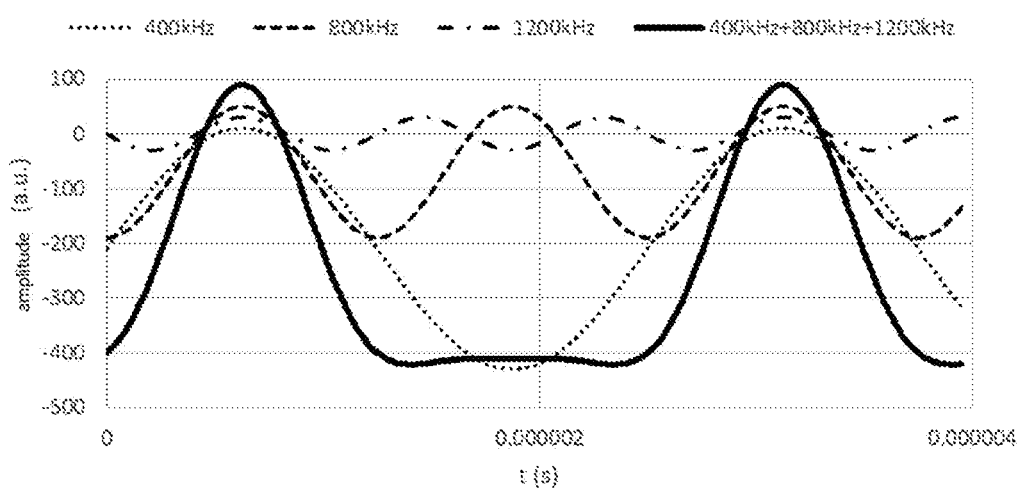
FIG. 7 is a simulation diagram of potential on the substrate upper surface generated by three radio-frequency power supplies according to one embodiment of the present disclosure.

FIG. 7 is a simulated diagram of potential on the upper surface of the substrate as generated by a combination of different radio-frequency power supplies according to another embodiment of the present disclosure. In this embodiment, there are three bias radio-frequency power supplies. The dotted line, the dashed line, and the dot-dash line respectively represent the curves of the potentials on the upper surface of the substrate as generated by the 400 KHz, 800 KHz, and 1200 KHz bias radio-frequency power supplies, respectively; in this embodiment, the frequencies of the three bias radio-frequency power supplies are 400 kHz, 800 kHz (400 KHz*2) and 1200 kHz (400 KHz*3), respectively, and the frequencies of the corresponding curves of the potentials generated on the upper surface of the substrate are also 400 kHz, 800 KHz and 1200 KHz, respectively. The phase difference between the potential curves generated by 400 KHz and 800 KHz is −90°, and the phase difference between the potential curves generated by 400 KHz and 1200 KHz is −180°. The amplitude ratio of the three potential curves is 7:4:1. it is seen from FIG. 6 that the compound potential curve superimposed by three potential curves with the characteristics above experiences three consecutive stages: falling stage, flat stage, and rising stage. The aggregate curve exhibits an approximate square wave pattern. The falling stage of the superimposed potential curve is steeper than the falling stage of any potential curve before superimposition, i.e., the potential change is faster. This causes distribution of the high-energy ions more concentrated. Similar to FIG. 5, in the flat stage, the compound potential is maintained at a substantially stable level within a certain time segment (e.g., ¼ period greater than 400 KHz, i.e., greater than about 0.6 µs); in this stage, the variation amplitude of the potential within a certain limit is permitted, e.g., the variation amplitude is within 5% or within 10%. It is noted that the compound potential curve superimposed by the three curves of the potential on the upper surface of the substrate as generated by the three radio-frequency power supplies has a more approximate square wave pattern than the compound potential curve in FIG. 5. The curve of its falling stage is even steeper, such that the distribution of the high-energy ions is more concentrated than the embodiment in FIG. 5.

Similar to using two bias radio-frequency power supplies in FIG. 5, tuning the frequency, phase or amplitude of the respective output voltages of two bias radio-frequency power supplies also enables the curve of the potential on the upper surface of the substrate to exhibit different approximate square wave patterns.

As shown by the two embodiments in FIG. 5 and FIG. 7, the present disclosure further comprises a method for tuning an output radio-frequency signal of a plasma processor, the method being conducted in a reaction chamber, the reaction chamber comprising a base, wherein the method comprises: outputting a high frequency radio-frequency signal into the reaction chamber; outputting a first radio-frequency frequency signal and a second radio-frequency frequency signal, the first frequency being smaller than the second frequency, the first radio-frequency frequency signal and the second radio-frequency frequency signal being superimposed to form a first compound signal that is applied to a base in the plasma processor; tuning at least one of amplitude, frequency, average voltage or phase of the first radio-frequency frequency signal and of the second radio-frequency frequency signal, such that the first compound signal experiences three consecutive stages in each cycle: falling stage, flat stage, and rising stage, wherein time taken by the falling stage in each cycle is less than half period of the first radio-frequency frequency signal, and duration of the flat stage is greater than ¼ period of the first radio-frequency frequency signal. The method further comprises: outputting a third radio-frequency frequency signal, the third frequency being greater than the first frequency and the second frequency, the third radio-frequency frequency signal being superimposed with the first radio-frequency frequency signal and the second radio-frequency frequency signal to form a second compound signal that is applied to the base in the plasma processor; tuning at least one of amplitude, frequency, average voltage or phase of the first radio-frequency frequency signal, of the second radio-frequency frequency signal, and of the third radio-frequency frequency signal such that the second compound signal experiences three consecutive stages in each cycle: falling stage, flat stage, and rising stage, wherein time taken by the falling stage of the second compound signal in each cycle is less than half period of the first radio-frequency frequency signal, and duration of the flat stage is greater than ¼ period of the first radio-frequency frequency signal.

Figure 8:
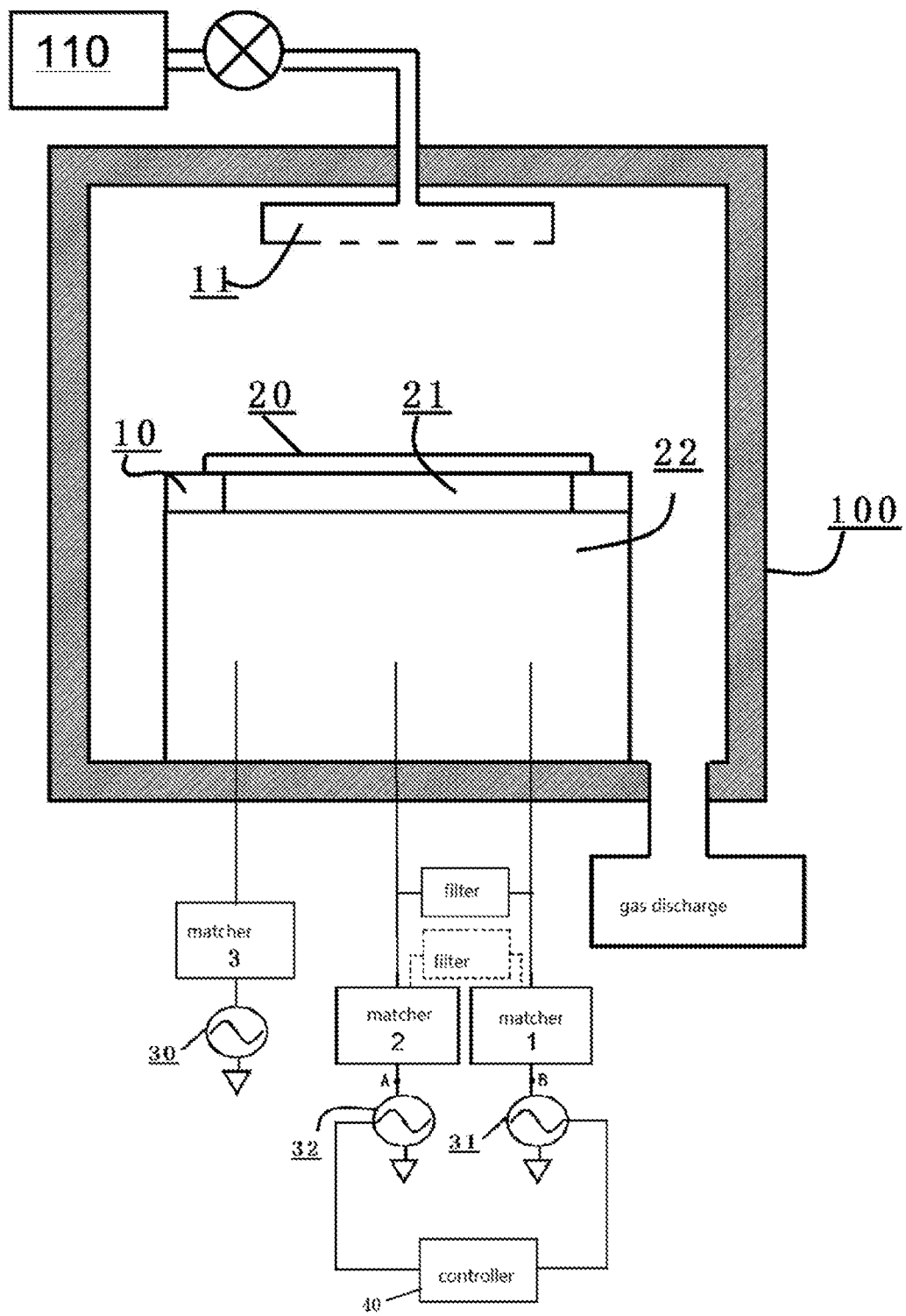
FIG. 8 is a structural schematic diagram of a capacitive coupling plasma processing apparatus in the present disclosure.

FIG. 8 illustrates a capacitive coupling plasma processing apparatus according to one embodiment of the present disclosure, which is configured for tuning ion energy ratio distribution in plasma. The plasma processing apparatus comprises a source radio-frequency power supply 30 and two bias radio-frequency power supplies 31, 32. The source radio-frequency power supply 30 outputs a high frequency radio-frequency signal to the base 22 so as to ignite and maintain plasma, and the two bias radio-frequency power supplies 31, 32 output low frequency signals to the base 22 so as to generate a bias voltage on the upper surface of the substrate. The controller 40 is connected to the bias radio-frequency power supplies 31, 32 and configured for controlling frequency, phase, and amplitude of the two respective bias radio-frequency power supplies. For example, the controller 40 enables the frequency of the two respective bias radio-frequency power supplies to have a multiple relationship, e.g., 400 KHz and 800 KHz, or 1 MHz and 2 MHz. For another example, the controller 40 controls the phase difference between the two bias radio-frequency power supplies to be 90° and locks the phase difference. The controller 40 can further tune the amplitude of the voltage generated on the upper surface of the substrate by tuning the power of the two respective bias radio-frequency power supplies. The three radio-frequency power supplies are connected to the base via three matchers 1-3, respectively, as shown in the figure. The matchers minimize the reflected power of the respective radio-frequency power supplies. As shown in the figure, a filter is provided between output ends of matcher 1 and matcher 2 and configured for isolating radio-frequency signals of different frequencies. Alternatively, the filter may also be provided between matcher 1 and matcher 2, as shown in the dashed block in the figure. Moreover, filters may also be provided at point A and point B between the radio-frequency power supplies 31, 32 and matchers 1, 2. The reaction chamber 100, focusing ring 10, substrate 20, electrostatic chuck 21, gas showerhead 11, and the reactant gas source 110 in the figure will not be detailed due to being not directly related to the subject matter of the present disclosure.

The two bias radio-frequency power supplies in the present disclosure may also be integrated into one radio-frequency power supply, such radio-frequency power supply including one signal generator; the signal generator generates an approximate square wave signal as shown in in FIGS. 5 and 6, and then an amplified approximate square wave signal is obtained via a power amplifier; next, the radio-frequency power with first frequency component (400 KHz) in the approximate square wave signal is separated via a first filter and is effectively fed into the plasma processor via a first matcher; the radio-frequency power with second frequency component is separated via a second filter and is fed into plasma processor via a second matcher, and finally, the compound approximate square wave signal is effectively outputted to the base 22 in the plasma processor.

Besides being applied to the capacitive coupling (CCP) plasma processor, the apparatus for tuning the ion energy ratio distribution in plasma according to the present disclosure may also be applied to an inductively coupled plasma processor (ICP). Moreover, the apparatus for tuning the ion energy ratio distribution in plasma according to the present disclosure is not limited to have two radio-frequency power supplies, which may have three or more bias radio-frequency power supplies. Theoretically, the more the radio-frequency power supplies used to form the compound signal, the more approximate the compound signal square wave. In one embodiment, when three bias radio-frequency power supplies are adopted, the radio-frequency frequency ratio therebetween is 1:2:3, e.g., 400 KHz, 800 KHz, 1200 KHz; or 600 KHz, 1200 KHz, 1800 KHz; or 800 KHz, 1600 KHz, 2400 KHz; or 1 MHz, 2 MHz, 3 MHz.

The apparatus for tuning ion energy ratio distribution in plasma according to the present disclosure enables dynamic tuning of the in-plasma ion energy density distributions for different etching processes and thus offers a higher flexibility. It has the following advantages: (1) the apparatus makes the high-energy ion energy ratio distribution more concentrated, offering a more effective bombardment on the wafer surface; (2) the ultra-high aspect ratio etching makes the apparatus more advantageous; (3) theoretically, the apparatus may effectively reduce the required radio-frequency power and lower the difficulty of designing the heat dissipation system of the chamber.

What have been described above are only preferred embodiments of the present disclosure; despite of those preferred embodiments disclosed above, the present disclosure is not limited thereto. Any technical person familiar with this field may make various possible alterations and modifications to the technical solutions of the present disclosure or modify them into equivalent varied embodiments using the methods and technical contents described above without departing from the scope of the technical solutions of the present disclosure. Therefore, any content without departing from the technical solutions of the present disclosure and any simple alteration, equivalent variation and modification to those embodiments based on the technical substance of the present disclosure still fall within the protection scope of the technical solutions of the present disclosure.

We claim:

1. A plasma processor, comprising:
   a reaction chamber, in the reaction chamber being provided a base, the base being used to hold a wafer;

a source radio-frequency power supply configured for outputting a high frequency radio-frequency power into the reaction chamber so as to ignite and maintain plasma;

a first bias radio-frequency power supply and a second bias radio-frequency power supply, the first bias radio-frequency power supply outputting a first radio-frequency signal with first frequency, the second bias radio-frequency power supply outputting a second radio-frequency signal with second frequency, the first frequency being smaller than the second frequency, the first radio-frequency signal and the second radio-frequency signal being superimposed to form a periodical first compound signal that is applied to the base;

and a controller configured for tuning at least one of amplitude, frequency, average voltage or phase of the first radio-frequency signal and of the second radio-frequency signal, such that the first compound signal includes three consecutive stages in each cycle: falling stage, flat stage, and rising stage, wherein time taken by the falling stage in said each cycle is less than half period of the first radio-frequency signal and is steeper than falling stage of the first radio-frequency signal and falling stage of the second radio-frequency signal, and duration of the flat stage is greater than ¼ period of the first radio-frequency signal.

2. The plasma processor according to claim 1, wherein the controller is configured for tuning the first frequency and the second frequency such that the second frequency is twice the first frequency.

3. The plasma processor according to claim 2, wherein the first frequency is selected from one of 400 KHz, 600 KHz, 800 KHz, or 1 MHz, and the second frequency is selected from one of 800 KHz, 1200 KHz, 1600 KHz, or 2 MHz.

4. The plasma processor according to claim 1, wherein the controller is configured for tuning the phase of the first radio-frequency signal and the phase of the second radio-frequency signal such that phase difference between the first radio-frequency signal and the second radio-frequency signal is between −75° and −105°.

5. The plasma processor according to claim 4, wherein the controller is configured for tuning the amplitude of the first radio-frequency signal and the amplitude of the second radio-frequency signal such that amplitude ratio of the first radio-frequency signal and the second radio-frequency signal is 4:12.8:1.

6. The plasma processor according to claim 1, wherein the controller is configured for tuning the phase and the amplitude of the first radio-frequency signal and tuning the amplitude and the phase of the second radio-frequency signal such that phase difference between the first radio-frequency signal and the second radio-frequency signal is −90°, and amplitude ratio of the first radio-frequency signal and the second radio-frequency signal is 3:1.

7. The plasma processor according to claim 1, wherein duration of the falling stage of the first compound signal is less than 35% of total duration of a period of the first compound signal.

8. The plasma processor according to claim 1, further comprising a first matching circuit, a second matching circuit, and a filter, the first matching circuit being arranged between the first bias radio-frequency power supply and the reaction chamber, the second matching circuit being arranged between the second bias radio-frequency power supply and the reaction chamber, and the filter being arranged between the first matching circuit and the second matching circuit.

9. The plasma processor according to claim 1, wherein the plasma processor further comprises: a third bias radio-frequency power supply configured for outputting a third radio-frequency signal with third frequency, the third frequency being greater than the first frequency and the second frequency, the third radio-frequency signal being superimposed with the first radio-frequency signal and the second radio-frequency signal to form a second compound signal that is applied to the base; the controller is configured for tuning at least one of the amplitude, the frequency, the average voltage or the phase of the first radio-frequency signal, of the second radio-frequency signal, and of the third radio-frequency signal such that the second compound signal includes three consecutive stages in each second compound signal cycle: falling stage, flat stage, and rising stage, wherein time taken by the falling stage of the second compound signal in each cycle is less than half period of the first radio-frequency signal, and duration of the flat stage is greater than ¼ period of the first radio-frequency signal.

10. The plasma processor according to claim 9, wherein the controller is configured for tuning frequency of the first radio-frequency signal, frequency of the second radio-frequency signal, and frequency of the third radio-frequency signal such that the second frequency is twice the first frequency, and the third frequency is thrice the first frequency.

11. The plasma processor according to claim 10, wherein the first frequency is selected from one of 400 KHz, 600 kHz, 800 KHz, or 1 MHz, the second frequency is selected from one of 800 KHz, 1200 KHz, 1600 KHz, or 2 MHz, and the third frequency is selected from one of 1200 KHz, 1800 KHz, 2400 KHz, or 3 MHz.

12. The plasma processor according to claim 9, wherein the controller is configured for tuning the phase and the amplitude of the first radio-frequency signal, the phase and the amplitude of the second radio-frequency signal, and the phase and amplitude of the third radio-frequency signal such that phase difference between the second radio-frequency signal and the first radio-frequency signal is −90°, phase difference between the third radio-frequency signal and the first radio-frequency signal is −180°, and amplitude ratio of the first radio-frequency signal, the second radio-frequency signal, and the third radio-frequency signal is 7:4:1.

13. A method for tuning radio-frequency signals applied to a plasma processor, the plasma processor comprising a reaction chamber, the reaction chamber including a base, wherein the method comprises: outputting a high frequency radio-frequency power into the reaction chamber;

outputting a first radio-frequency signal with first frequency and a second radio-frequency signal with second frequency, the first frequency being smaller than the second frequency, the first radio-frequency signal and the second radio-frequency signal being superimposed to form a first compound signal that is applied to the base in the plasma processor;

and tuning at least one of amplitude, frequency, average voltage or phase of the first radio-frequency signal and of the second radio-frequency signal, such that the first compound signal includes three consecutive stages in each cycle: falling stage, flat stage, and rising stage, wherein time taken by the falling stage in each cycle is less than half period of the first radio-frequency signal and is steeper than falling stage of the first radio-frequency signal and falling stage of the second radio-frequency signal, and duration of the flat stage is greater than ¼ period of the first radio-frequency signal.

14. The method according to claim 13, wherein the frequency of the second radio-frequency signal is tuned to be twice the frequency of the first radio-frequency signal.

15. The method according to claim 13, wherein the method further comprises:
outputting a third radio-frequency signal, the third frequency being greater than the first frequency and the second frequency, the third radio-frequency signal being superimposed with the first radio-frequency signal and the second radio-frequency signal to form a second compound signal that is applied to the base in the plasma processor;
and tuning at least one of the amplitude, the frequency, the average voltage or the phase of the first radio-frequency signal, of the second radio-frequency signal, and of the third radio-frequency signal such that the second compound signal includes the three consecutive stages in each cycle: falling stage, flat stage, and rising stage, wherein time taken by the falling stage of the second compound signal in each cycle is less than half period of the first radio-frequency signal, and duration of the flat stage is greater than ¼ period of the first radio-frequency signal.

16. The method according to claim 15, wherein the frequency of the second radio-frequency signal is tuned to be twice the frequency of the first radio-frequency signal, and the frequency of the third radio-frequency signal is tuned to be thrice the frequency of the first radio-frequency signal.

17. A plasma processor, comprising:
a reaction chamber, in the reaction chamber being provided a base, the base being used to hold a wafer;
a source radio-frequency power supply configured for outputting a high frequency radio-frequency power into the reaction chamber so as to ignite and maintain plasma;
and a first bias radio-frequency power supply and a second bias radio-frequency power supply, the first bias radio-frequency power supply outputting a first radio-frequency signal with first frequency, the second bias radio-frequency power supply outputting a second radio-frequency signal with second frequency, the first frequency being smaller than the second frequency, the first radio-frequency signal and the second radio-frequency signal being superimposed to form a periodical first compound signal that is applied to the base; a controller configured for tuning at least one of amplitude, frequency, average voltage or phase of the first radio-frequency signal and of the second radio-frequency signal, such that the first compound signal includes three consecutive stages in each cycle: rising stage, flat stage, and falling stage, wherein time taken by the falling stage in said each cycle is less than half period of the first radio-frequency signal and is steeper than falling stage of the first radio-frequency signal and falling stage of the second radio-frequency signal, and duration of the flat stage is greater than ¼ period of the first radio-frequency signal.

18. A plasma processor, comprising:
a reaction chamber, in the reaction chamber being provided a base, the base being used to hold a wafer;
a source radio-frequency power supply configured for outputting a high frequency radio-frequency power into the reaction chamber so as to ignite and maintain plasma;
a bias radio-frequency power supply including a signal generator, the signal generator being configured for generating a periodical wave, each cycle of the periodical wave includes three consecutive stages: falling stage, flat stage, and rising stage, wherein duration of the flat stage is greater than ¼ of the period;
a first filter, configured for selectively passing a first radio-frequency signal with first frequency from the periodical wave;
a second filter, configured for selectively passing a second radio-frequency signal with second frequency from the periodical wave;
a first matching circuit, configured for matching the first radio-frequency signal with first frequency and inputting the first radio-frequency signal into the reaction chamber;
and a second matching circuit, configured for matching the radio-frequency signal with second frequency and inputting the second radio-frequency signal into the reaction chamber;
wherein the first radio-frequency signal and the second radio-frequency signal being superimposed to form a periodical first compound signal, the first compound signal includes three consecutive stages in each cycle: rising stage, flat stage, and falling stage, wherein time taken by the falling stage in said each cycle is less than half period of the first radio-frequency signal and is steeper than falling stage of the first radio-frequency signal and falling stage of the second radio-frequency signal, and duration of the flat stage is greater than ¼ period of the first radio-frequency signal.

* * * * *